(12) United States Patent
Guo et al.

(10) Patent No.: US 12,108,533 B2
(45) Date of Patent: Oct. 1, 2024

(54) CIRCUIT BOARD AND METHOD FOR MANUFACTURING THEREOF

(71) Applicants: Avary Holding (Shenzhen) Co., Ltd., Shenzhen (CN); QingDing Precision Electronics(Huai'an) Co., Ltd., Jiangsu Province (CN); Garuda Technology Co., Ltd., New Taipei (TW)

(72) Inventors: Zhi Guo, Shenzhen (CN); Chen Xiong, Shenzhen (CN); Po-Yuan Chen, Shenzhen (CN)

(73) Assignees: AVARY HOLDING (SHENZHEN) CO., LTD., Shenzhen (CN); QINGDING PRECISION ELECTRONICS (HUAI'AN) CO., LTD., Jiangsu Province (CN); GARUDA TECHNOLOGY CO., LTD., New Taipei (TW)

( * ) Notice: Subject to any disclaimer, the term of this patent is extended or adjusted under 35 U.S.C. 154(b) by 301 days.

(21) Appl. No.: 17/855,032

(22) Filed: Jun. 30, 2022

(65) Prior Publication Data
US 2023/0389185 A1    Nov. 30, 2023

(30) Foreign Application Priority Data
May 31, 2022   (CN) .......................... 202210608047.0

(51) Int. Cl.
*H05K 1/18*    (2006.01)
*H05K 3/32*    (2006.01)

(52) U.S. Cl.
CPC ............. *H05K 1/183* (2013.01); *H05K 3/321* (2013.01); *H05K 2201/10984* (2013.01)

(58) Field of Classification Search
CPC ...... H05K 1/0204; H05K 1/183; H05K 1/185; H05K 2201/10416; H05K 2201/10984; H05K 3/321; H05K 3/4697
See application file for complete search history.

(56) References Cited

U.S. PATENT DOCUMENTS

2018/0202723 A1*  7/2018  Huang ................... H01L 23/427
2020/0275583 A1*  8/2020  Lee ......................... H05K 7/205
(Continued)

FOREIGN PATENT DOCUMENTS

CN    109152311 A    1/2019
CN    111010797 A    4/2020
(Continued)

*Primary Examiner* — William H. Mayo, III
*Assistant Examiner* — Rhadames Alonzo Miller
(74) *Attorney, Agent, or Firm* — MUNCY GEISSLER OLDS & LOWE P.C.

(57) ABSTRACT

A method for manufacturing a circuit board includes disposing an electronic component in a recess formed in a first circuit substrate, and bonding a second circuit substrate to the first circuit substrate to form a third circuit substrate with the electronic component embedded. The method includes forming an opening in the third circuit substrate to expose the electronic component and an inner surface of the third circuit substrate. The method includes disposing an insulation case in the opening. The insulation case has a first segment directly contacting the electronic component, a second segment facing the inner surface, an inner wall between the first and second segments, a first chamber surrounded by the first segment and the inner wall, and a second chamber surrounded by the second segment and the inner wall. The method includes adding a heat-exchanging fluid into the first chamber.

20 Claims, 5 Drawing Sheets

(56) References Cited

U.S. PATENT DOCUMENTS

2022/0386506 A1* 12/2022 Yang ................. G06F 1/203
2023/0180382 A1*  6/2023 Liao ................. H05K 3/4697
                                                        361/699

FOREIGN PATENT DOCUMENTS

| CN | 110191621 B | 3/2021 |
| CN | 113453517 A | 9/2021 |
| TW | 202205930 A | 2/2022 |
| TW | 202214085 A | 4/2022 |

* cited by examiner

CIRCUIT BOARD AND METHOD FOR MANUFACTURING THEREOF

CROSS-REFERENCE TO RELATED APPLICATION

This application claims priority to China Application Serial Number 202210608047.0, filed May 31, 2022, which is herein incorporated by reference in its entirety.

BACKGROUND

Field of Invention

The present application relates to a circuit board and a method for manufacturing thereof, and particularly to a circuit board with an embedded electronic component and a method for manufacturing thereof.

Description of Related Art

Advances in electronic products have increased the demand for fast speed, high reliability, multiple function, miniature, and high performance. To meet this demand, the communication distance among the electronic components and the footprint of wiring in the circuit board may be designed to be reduced, which can be achieved by embedding the electronic components in the circuit board. Therefore, it is a challenge to increase the reliability and performance of the circuit board with the embedded electronic component.

SUMMARY

An aspect of the present application provides a method for manufacturing a circuit board. The method for manufacturing the circuit board includes forming a recess in a first circuit substrate, disposing an electronic component in the recess, and bonding a second circuit substrate to the first circuit substrate such that the second circuit substrate and the first circuit substrate collectively form a third circuit substrate. The electronic component is embedded in the third circuit substrate. The method for manufacturing the circuit board further includes forming an opening in the third circuit substrate to expose the electronic component and an inner surface of the third circuit substrate in the opening, and disposing an insulation case in the opening. The insulation case includes a first segment surrounding and directly contacting the electronic component, a second segment positioned by the first segment and facing the inner surface, an inner wall between the first segment and second segment, a first chamber surrounded by the first segment and the inner wall, and a second chamber surrounded by the second segment and the inner wall. The method for manufacturing the circuit board further includes adding a heat-exchanging fluid into the first chamber.

An aspect of the present application provides a circuit board. The circuit board includes a circuit substrate, an electronic component embedded in the circuit substrate, and an insulation case embedded in the circuit substrate and between the circuit substrate and the electronic component. The insulation case includes a first segment surrounding and directly contacting the electronic component, a second segment positioned by the first segment and facing an inner surface of the circuit substrate, an inner wall between the first segment and second segment, a first chamber surrounded by the first segment and the inner wall, and a second chamber surrounded by the second segment and the inner wall. The circuit board further includes a heat-exchanging fluid distributed in the first chamber.

The present application discloses various embodiments to provide a circuit board and a method for manufacturing thereof. An electronic component and an insulation case are embedded in a circuit board, and the electronic component is surrounded by the insulation case having several chambers to provide various functions. Thus, the reliability and performance of the circuit board can be enhanced.

It is to be understood that both the foregoing general description and the following detailed description are by examples, and are intended to provide further explanation of the disclosure as claimed.

BRIEF DESCRIPTION OF THE DRAWINGS

Aspects of the present application are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

A first feature over or on a second feature in the description that follows may include embodiments in which the first and second features are formed in direct contact, and may also include embodiments in which additional features may be formed between the first and second features, such that the first and second features may not be in direct contact. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

As advances in electronic products have increased the demand for fast speed, high reliability, multiple function, miniature, and high performance, the application of embedded capacitor in a circuit board has widely implemented to achieve a high-density package of electronic products. The communication distance among the electronic components and the footprint of wiring in the circuit board may be designed to be reduced by embedding the capacitor into the circuit board, thereby scaling down the circuit board.

As a capacitor embedded in a circuit board produces heat during operation, heat can be dissipated through the heat-dissipating member to prevent heat from accumulating in the capacitor and the circuit board. A risk of overheat of the capacitor or other electronic components can be reduced, and therefore the performance of the electronic product can be enhanced.

Further, parasitic capacitance may exist between the capacitor and circuit or the electronic component because of their proximity to each other. Parasitic capacitance may cause resistive-capacitive delay (RC delay), hindering the further increasing of speed and the performance of the electronic product. The effect of parasitic capacitance may particularly be obvious as the application of circuit board has been developed toward high frequency.

In general, a capacitor, for example a parallel-plate capacitor, can include two electrodes (e.g., copper) stacked to each other and a dielectric material sandwiched between the two electrodes. The capacitance of the capacitor is proportional to the overlapping area between the two electrodes (i.e., the area of one electrode facing to the other). Hence, the capacitance consistency among each capacitor can be influenced by the manufacture accuracy of the area of the electrode facing to the other.

The present application provides a circuit board with an embedded capacitor and a method for manufacturing thereof to facilitate heat dissipation out of the circuit board, eliminate parasitic capacitance and increase manufacture accuracy, thereby enhancing the reliability and performance of the capacitor and the circuit board.

Various operations of embodiments are provided herein. Unless otherwise defined, the order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments.

Figure 1:
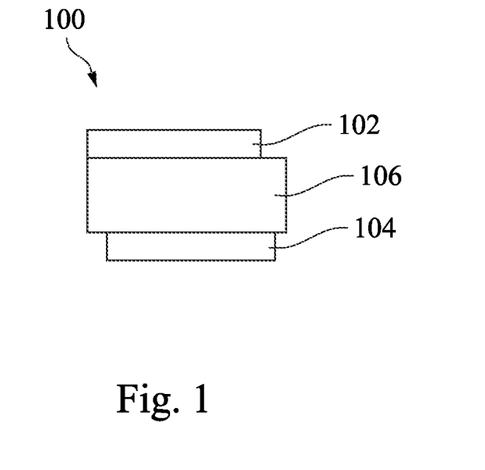
FIG. 1, FIG. 2 and FIG. 3A are cross-sectional views of a circuit board at various process stages according to some embodiments of the present application.

Referring to FIG. 1, FIG. 1 is a cross-sectional view of a circuit board at one of process stages according to some embodiments of the present application. FIG. 1 illustrates a process of providing an electronic component 100. The electronic component 100 can be a passive component, for example a capacitor, an inductor, a resistor and the like.

In some embodiment as shown in FIG. 1, the electronic component 100 is a capacitor including a first electrode 102, a second electrode 104 disposed on the first electrode 102, and a dielectric layer 106 disposed between the first electrode 102 and the second electrode 104. When the electronic component 100 is a parallel-plate capacitor, a plate of the first electrode 102 and a plate of the second electrode 104 face each other, and the dielectric layer 106 is sandwiched between the first electrode 102 and the second electrode 104.

The first electrode 102 and the second electrode 104 can be aligned to each other. In some embodiments, a sidewall of the first electrode 102 and a sidewall of the second electrode 104 can be flush to each other. In some other embodiments, the sidewall of the first electrode 102 may deviate from and the sidewall of the second electrode 104, and the sidewall of the first electrode 102 and the sidewall of the second electrode 104 cannot be flush with each other.

The material of the first electrode 102 can include metal, such as copper (Cu). The material of the second electrode 104 can include metal, such as copper (Cu). In some embodiments, the first electrode 102 and the second electrode 104 can be made up with the same material. The dielectric layer 106 can be a dielectric material, such as silicon oxide, silicon nitride, aluminum oxide, titanium oxide, tantalum oxide, high-κ dielectric material (e.g., a material with a dielectric constant (κ) larger than 3.9), or other suitable materials.

Figure 2:
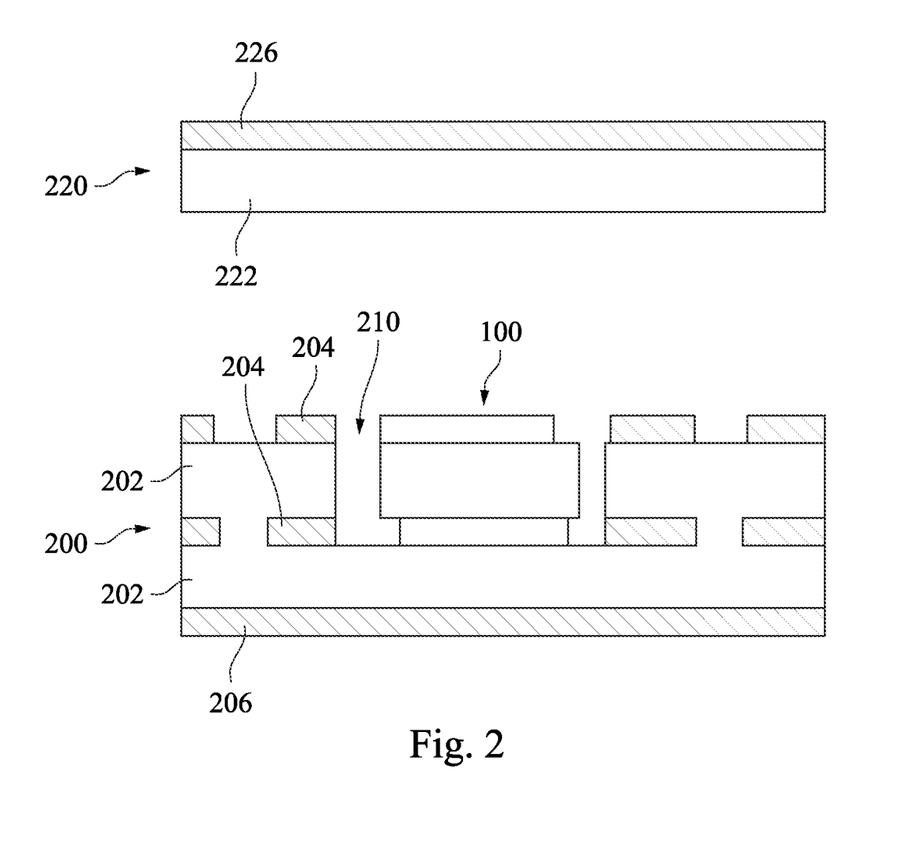

Referring to FIG. 2, FIG. 2 is a cross-sectional view of a circuit board at one of process stages according to some embodiments of the present application. FIG. 2 illustrates a process of providing a first circuit substrate 200 and forming a recess 210 in the first circuit substrate 200. After forming the recess 210, disposing the electronic component 100 in the recess 210. The recess 210 can contain the electronic component 100 since a size of the recess 210 is larger than a size of the electronic component 100.

The number of layers of the first circuit substrate 200 can be adjusted according to product requirements. The first circuit substrate 200 can include an insulation layer 202, a circuit layer 204, a conductive blind hole (not shown herein), or a pad (not shown herein). In some embodiments, an outermost layer of the first circuit substrate 200 can be a foil layer 206. In some other embodiments, the foil layer 206 can be patterned to form an outermost circuit layer (not shown herein) or pad (not shown herein) of the first circuit substrate 200.

The recess 210 can be formed by a routing process, a laser process, mechanical drill process, an etching process (e.g., wet etching), other suitable processes, or a combination of thereof. The insulation layer 202 of the first circuit substrate 200 may include polymeric or non-polymeric dielectric materials such as, but not limited to, liquid crystal polymer (LCP), bismaleimide-triazine (BT), prepreg, Ajinomoto build-up film (ABF), epoxy, polyimide (PI), other suitable dielectric materials, or a combination thereof. In some embodiments, the insulation layer 202 of the first circuit substrate 200 can be made of photoimageable dielectric materials or photoactive dielectric materials.

Subsequently, a second circuit substrate 220 is provided. The second circuit substrate 220 may be disposed on the first circuit substrate 200 and the electronic component 100. The second circuit substrate 220 can be combined with the first circuit substrate 200 in the following process to package the electronic component 100.

The second circuit substrate 220 can include an insulation layer 222, a circuit layer (not shown herein), a conductive blind hole (not shown herein), or a pad (not shown herein). In some embodiments, the second circuit substrate 220 can be made of copper clad laminate (CCL). An outermost layer of the second circuit substrate 220 can be a foil layer 226. It is noted that the number of layers of insulation layer 222 and the foil layer 226 can be adjusted according to process conditions or product requirements despite the fact that FIG. 2 illustrates single layer of insulation layer 222 and single layer of the foil layer 226.

The insulation layer 222 of the second circuit substrate 220 may include polymeric or non-polymeric dielectric materials such as, but not limited to, LCP, BT, prepreg, ABF, epoxy, PI, other suitable dielectric materials, or a combination thereof. In some embodiments, the insulation layer 222 of the second circuit substrate 220 can be made of photo-imageable dielectric materials or photoactive dielectric materials.

Figure 3A:
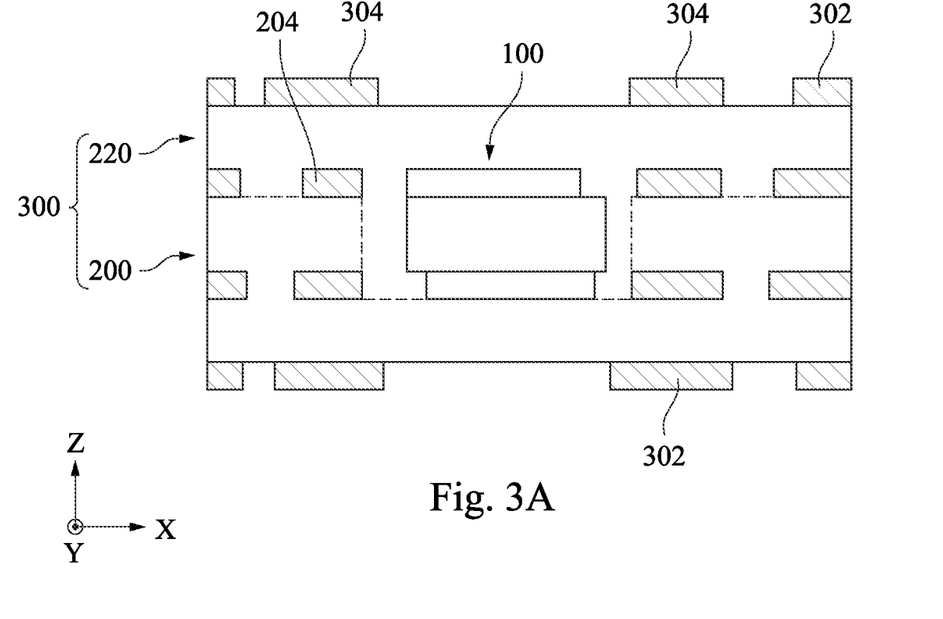

Referring to FIG. 3A, FIG. 3A is a cross-sectional view of a circuit board at one of process stages according to some embodiments of the present application. FIG. 3A illustrates a process of bonding the first circuit substrate 200 and the second circuit substrate 220. The first circuit substrate 200 or the second circuit substrate 220 can include an adhesive material. In some embodiments, during the process of bonding the first circuit substrate 200 and the second circuit substrate 220, the adhesive material may be squeezed and accordingly distributed in the recess 210 (referring to FIG. 2), between the first circuit substrate 200 and the electronic component 100, between the second circuit substrate 220 and the electronic component 100, between the first circuit substrate 200 and the second circuit substrate 220, or other space to accommodate the adhesive material. Further, the adhesive material can be cured due to the temperature applied in the bonding process. After the bonding process, the second circuit substrate 220 and the first circuit substrate 200 can collectively form a third circuit substrate 300. The electronic component 100 can be embedded in the third circuit substrate 300. In some embodiments, the recess 210 can be entirely filled with the adhesive material, and the adhesive material may contact (e.g., directly contact) the electronic component 100. As a result, the electronic component 100 can be secured in the third circuit substrate 300.

After the bonding process, the foil layer 206 (referring to FIG. 2) and the foil layer 226 (referring to FIG. 2) can be patterned to form a circuit layer 302 of the third circuit substrate 300. In some embodiments as shown in FIG. 3A, after the foil layer 226 is patterned, one portion of the patterned foil layer 226 can become the circuit layer 302 to transmit electrical signal, and another portion of the patterned foil layer 226 can become a heat-dissipating member 304 which is not used to transmit electrical signal. Consequently, the heat-dissipating member 304 may be electrically isolated from other conductive components.

Figure 3B:
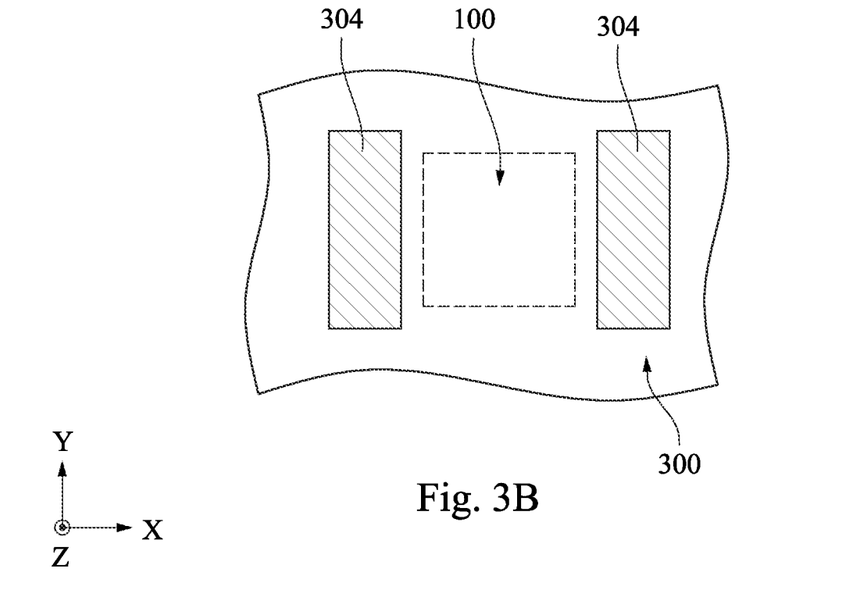
FIG. 3B is a top view of a portion of the circuit board of FIG. 3A according to some embodiments of the present application.

Referring to FIG. 3B, FIG. 3B is a top view of a portion of the circuit board of FIG. 3A according to some embodiments of the present application to provide an exemplary arrangement of the heat-dissipating member 304 and the electronic component 100. The heat-dissipating member 304 is disposed on the third circuit substrate 300, and the electronic component 100 is disposed in the third circuit substrate 300. The broken line in FIG. 3B indicates an exemplary arrangement of the electronic component 100 within the third circuit substrate 300. It is noted that, for the purpose of clarity, FIG. 3B has been simplified and only a few components are illustrated in FIG. 3B. Therefore, components shown in the FIG. 3B (top view) may not totally correspond to the components shown in in FIG. 3A (cross-sectional view).

In some embodiments as shown in FIG. 3B, the location of the electronic component 100 and the location of the heat-dissipating member 304 can be spaced apart from each other in a lateral direction (e.g., spaced apart in the X direction) in order to decrease parasitic capacitance existing between the electronic component 100 and conductive components (e.g., the heat-dissipating member 304 including metallic material) in proximity to the electronic component 100. In other words, a projection of the heat-dissipating member 304 on the third circuit substrate 300 is separated from a projection of the electronic component 100 on the third circuit substrate 300.

Figure 4:
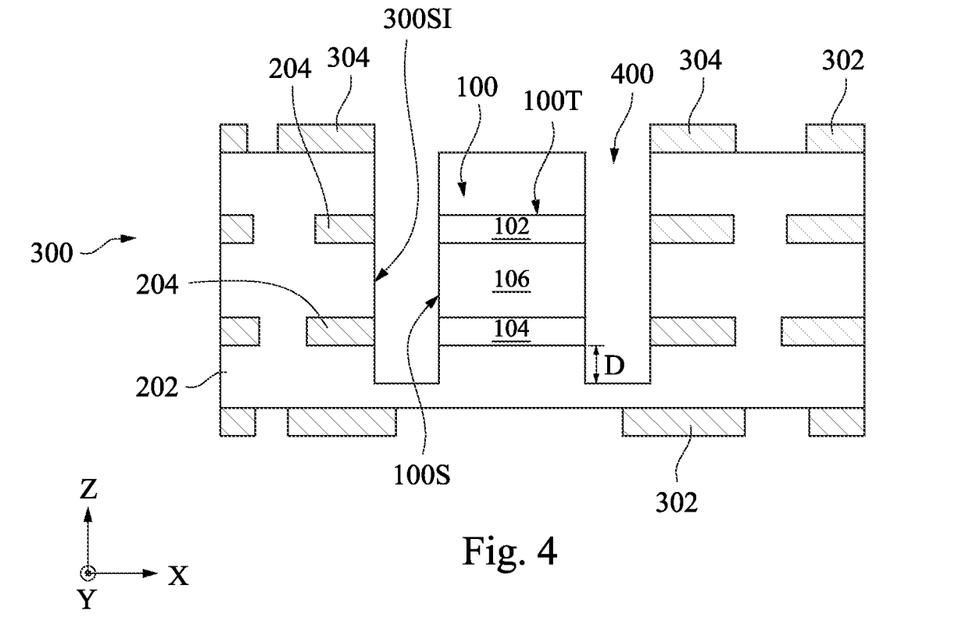
FIG. 4, FIG. 5, FIG. 6, FIG. 7, FIG. 8 and FIG. 9 are cross-sectional views of a circuit board at various process stages according to some embodiments of the present application.

Referring to FIG. 4, FIG. 4 is a cross-sectional view of a circuit board at one of process stages according to some embodiments of the present application. FIG. 4 illustrates a process of forming an opening 400 in the third circuit substrate 300 to expose the electronic component 100 and an inner surface 300SI of the third circuit substrate 300 in the opening 400. In some embodiments, the opening 400 exposes a side surface 100S of the electronic component 100. In some embodiments, the opening 400 exposes the side surface 100S and a top surface 100T of the electronic component 100. In some embodiments, the opening 400 exposes the side surface 100S of the electronic component 100 but not expose the top surface 100T of the electronic component 100.

In the process of forming the opening 400 in the third circuit substrate 300, a portion of the electronic component 100 may be removed, and therefore the profile of the electronic component 100 can be trimmed. For example, a portion of the first electrode 102 may be removed, a portion of the second electrode 104 may be removed, or a portion of the dielectric layer 106 may be removed. The side surface 100S of the trimmed electronic component 100 can be vertical (e.g., the side surface 100S extends along the Z axis). In addition, the side surface 100S of the trimmed electronic component 100 may be parallel to the inner surface 300SI of the third circuit substrate 300.

When the electronic component 100 is a capacitor, a side surface of the first electrode 102, a side surface of the second electrode 104, and a side surface of the dielectric layer 106 are coplanar to each other. Therefore, a sidewall of the first electrode 102 and a sidewall of the second electrode 104 can be flush to each other, such that the first electrode 102 can be aligned with the second electrode 104.

The present application provides a process of bonding a capacitor, subsequently disposing the capacitor in a circuit substrate, and then forming an opening in the circuit substrate to trim the profile of the capacitor, which can have benefit of the manufacture accuracy. As discussed previously, the capacitance of the capacitor is proportional to the overlapping area between the two electrodes (i.e., the area of one electrode facing to the other). Hence, the capacitance consistency among each capacitor can be improved by the manufacture accuracy of the area of the electrode facing to the other, thereby enhancing the reliability of the capacitor.

The opening 400 may extend from a top surface of the third circuit substrate 300 to an inside of the third circuit substrate 300. A bottom of the opening 400 may be below a bottom of the electronic component 100. In some embodiment where the electronic component 100 is a capacitor, the bottom of the opening 400 is below a bottom of the second electrode 104. Specifically speaking, a portion of the insulation layer 202 around the electronic component 100 is removed. A distance D between the bottom of the opening 400 and the bottom of the electronic component 100 is equal to or larger than about 10 μm. If the distance D is less than 10 μm, a portion of the insulation layer 202 around the electronic component 100 may not be removed enough such that a remaining portion of the insulation layer 202 sandwiched between the electronic component 100 and the circuit layer 204 may cause the parasitic capacitance, further influencing the performance of the electronic component 100.

The opening 400 can be formed by a routing process, a laser process, mechanical drill process, an etching process (e.g., wet etching), other suitable processes, or a combination of thereof.

Figure 5:
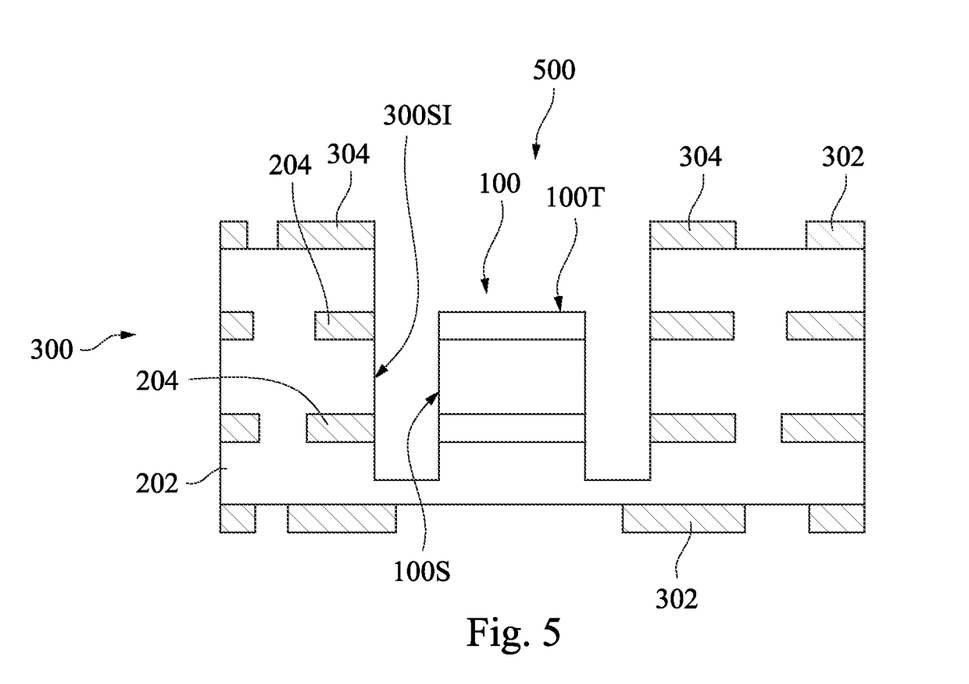

Referring to FIG. 5, FIG. 5 is a cross-sectional view of a circuit board at one of process stages according to some embodiments of the present application. In some embodiments, after the opening 400 (referring to FIG. 4) is formed, the third circuit substrate 300 may remain covering the top surface 100T of the electronic component 100, indicating that the opening 400 does not expose the top surface 100T of the electronic component 100. Therefore, FIG. 5 illustrates a process of further removing a portion of the third circuit substrate 300 which is positioned on the top surface 100T of the electronic component 100 to expand the opening 400 into an opening 500. The opening 500 can expose the top surface 100T of the electronic component 100, the side surface 100S of the electronic component 100 and the inner surface 300SI of the third circuit substrate 300. In some embodiments as shown in FIG. 4 and FIG. 5, the opening 500 is basically similar to the opening 400. The only difference is that the opening 500 additionally expose the top surface 100T of the electronic component 100.

The opening 500 can be formed by a routing process, a laser process, mechanical drill process, a peeling process, other suitable processes, or a combination of thereof.

Figure 6:
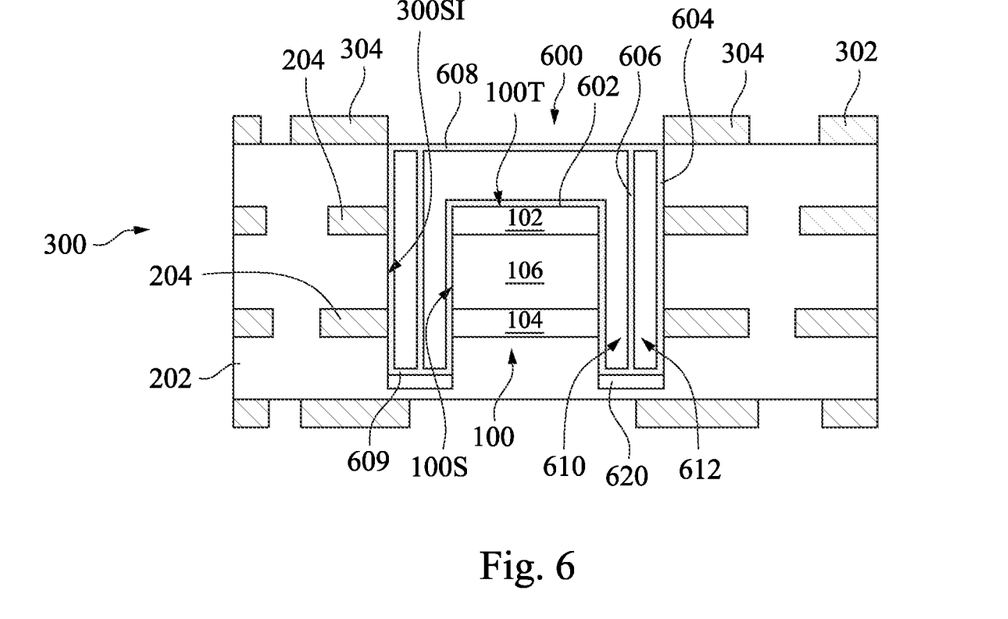

Referring to FIG. 6, FIG. 6 is a cross-sectional view of a circuit board at one of process stages according to some embodiments of the present application. FIG. 6 illustrates a process of disposing an insulation case 600 in the opening 500 (referring to FIG. 5). Particularly, the insulation case 600 is disposed between the third circuit substrate 300 and the electronic component 100. The position of the insulation case 600 is below the position of the heat-dissipating member 304, for example below than a lower surface of the heat-dissipating member 304. As a result, the insulation case 600 can be embedded in the third circuit substrate 300.

The profile of the insulation case 600 is related to the arrangement between the third circuit substrate 300 and the electronic component 100. In some embodiments as shown in FIG. 6, a cross-sectional profile of the insulation case 600 is an inverted-U shape to fit the arrangement between the third circuit substrate 300 and the electronic component 100.

The insulation case 600 can include a first segment 602, a second segment 604 and an inner wall 606. The first segment 602 can surround and directly contact the electronic component 100. The second segment 604 can be positioned by the first segment 602 and face the inner surface 300SI of the third circuit substrate 300. The inner wall 606 can be between the first segment 602 and the second segment 604. The insulation case 600 can further include a third segment 608 exposed in the third circuit substrate 300. The third segment 608 can be connected to the first segment 602 and the second segment 604. The insulation case 600 can further include a fourth segment 609 positioned below the bottom of the electronic component 100. In some embodiments, the fourth segment 609 is positioned near the bottom of the opening 500 (referring to FIG. 5). The fourth segment 609 can be connected to the first segment 602 and the second segment 604.

In a greater detail, when the opening 500 (referring to FIG. 5) exposes the top surface 100T and the side surface 100S of the electronic component 100, the first segment 602 of the insulation case 600 can directly contact the top surface 100T and the side surface 100S of the electronic component 100. In some embodiments, the second segment 604 of the insulation case 600 directly contacts the inner surface 300SI of the third circuit substrate 300. In some other embodiments, the second segment 604 of the insulation case 600 does not contact the inner surface 300SI of the third circuit substrate 300. That is, the second segment 604 may be spaced apart from the inner surface 300SI of the third circuit substrate 300.

In some embodiments where the electronic component 100 is a capacitor, the first segment 602 of the insulation case 600 directly contacts the side surface of the first electrode 102, the side surface of the second electrode 104, and the side surface of the dielectric layer 106. The first segment 602 of the insulation case 600 can further be in direct contact with a top surface of the first electrode 102. Moreover, a bottom surface of the second electrode 104 can directly contact the third circuit substrate 300.

The insulation case 600 is hollow and includes an enclosed space. The enclosed space can be divided into several chambers due to the inner wall 606. In FIG. 6, the insulation case 600 can include a first chamber 610 and a second chamber 612, both of which are respectively an enclosed subspace. The first chamber 610 can be surrounded by the first segment 602, the inner wall 606, the third segment 608 and the fourth segment 609, and the second chamber 612 can be surrounded by the second segment 604, the inner wall 606, the third segment 608 and the fourth segment 609. The first chamber 610 or the second chamber 612 may be a vacuum chamber. The first chamber 610 or the second chamber 612 may not be a vacuum chamber. For example, a gas (e.g., air) can be present in the first chamber 610 or the second chamber 612.

The insulation case 600 can be made of dielectric materials, such as silicon oxide, silicon nitride, silicon oxynitride, phosphosilica glass (PSG), borosilica glass (BSG), borophosphosilica glass (BPSG), fluoride silicate glass (FSG), xerogel, aerogel, amorphous fluorinated carbon, parylene, benzocyclobutene, polyimide (PI), other suitable dielectric material, a combination thereof. Since the insulation case 600 is positioned between the electronic component 100 and the circuit layer 204, the material of the insulation case 600 can be selected to be a low-κ dielectric material (e.g., a material with a dielectric constant (κ) less than 3.9), such as porous silicon oxide, porous fluoride, silicon carbide, carbon-doped oxide or the like, to reducing the parasitic capacitance.

The insulation case 600 can be formed by injection molding, extrusion, blow molding, other suitable techniques, or a combination thereof.

In some embodiments, a process of disposing the insulation case 600 in the opening 500 (referring to FIG. 5) can include disposing an adhesive material 620 at the bottom of the opening 500 and then placing the insulation case 600 into the opening 500. In some other embodiments, a process of disposing the insulation case 600 in the opening 500 (referring to FIG. 5) can include disposing the adhesive material 620 on the insulation case 600 and then placing the insulation case 600 along with the adhesive material 620 into the opening 500.

The adhesive material 620 can be disposed between the insulation case 600 and the third circuit substrate 300 to bond the insulation case 600 and the third circuit substrate 300, thereby fixing the insulation case 600 in the third circuit substrate 300. In some embodiments, the adhesive material 620 directly contacts the insulation case 600 and the third circuit substrate 300. In some embodiments as shown in FIG. 6, the adhesive material 620 directly contacts the fourth segment 609 and the third circuit substrate 300. The material of the adhesive material 620 can include epoxy, PI, polyurethane, or other suitable materials. In some embodiments, the adhesive material 620 can be a pressure sensitive adhesive material.

Figure 7:
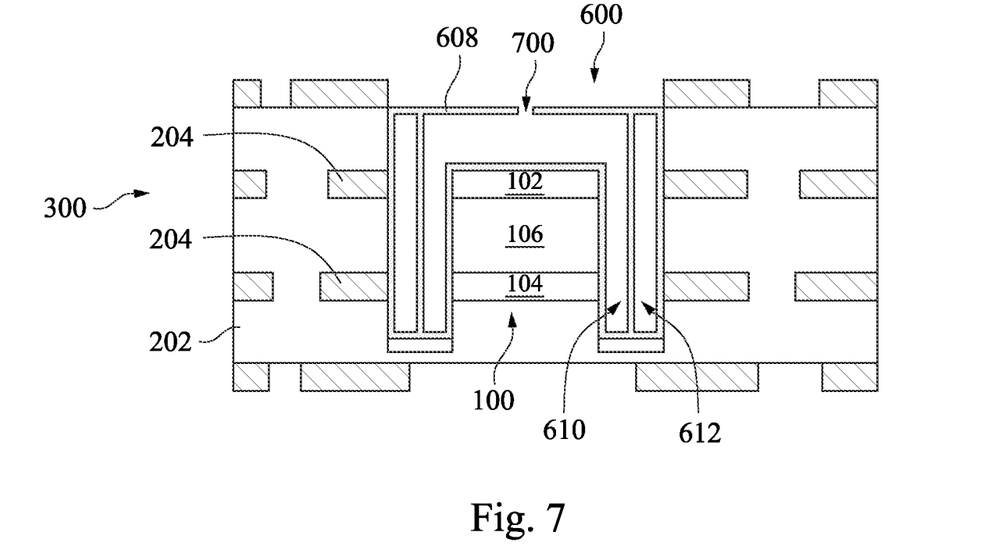

Referring to FIG. 7, FIG. 7 is a cross-sectional view of a circuit board at one of process stages according to some embodiments of the present application. FIG. 7 illustrates a process of forming a hole 700 in the insulation case 600. Particularly, the hole 700 can be formed in the third segment 608, causing the first chamber 610 not having an enclosed subspace due to the hole 700. In other words, the first chamber 610 can be connected to the external environment due to the hole 700.

Figure 8:
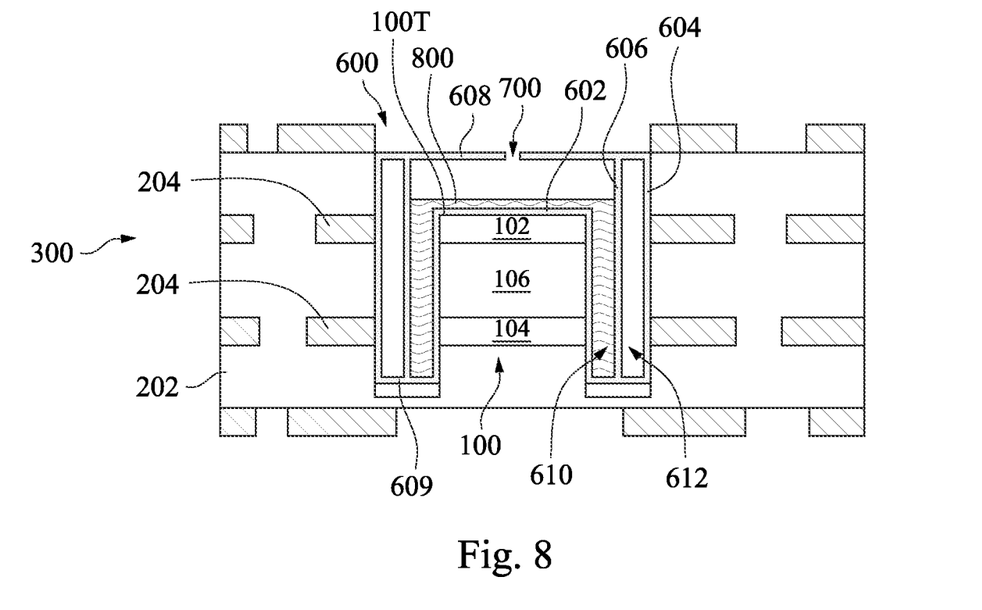

Referring to FIG. 8, FIG. 8 is a cross-sectional view of a circuit board at one of process stages according to some embodiments of the present application. FIG. 8 illustrates a process of adding a heat-exchanging fluid 800 into the insulation case 600. Specifically speaking, the heat-exchanging fluid 800 can be added into the first chamber 610 through the hole 700. The heat-exchanging fluid 800 can directly contact the first segment 602 and the inner wall 606.

In the following processes, the heat-exchanging fluid 800 can be sealed and distributed in the first chamber 610. Therefore, the heat-exchanging fluid 800 around the electronic component 100 (e.g., by or on the electronic component 100 can improve the heat dissipation efficiency.

In some embodiments, the heat-exchanging fluid 800 can flow in the first chamber 610. Further, the heat-exchanging fluid 800 can include a liquid and a gas in the first chamber 610. That is, the heat-exchanging fluid 800 can be in a form of liquid and in a form of gas. The amount of the heat-exchanging fluid 800 can be varied according to process conditions or product requirements. In some embodiments, a liquid level of the heat-exchanging fluid 800 in the first chamber 610 is identical to or higher than the top surface 100T of the electronic component 100. It is noted that the liquid level of the heat-exchanging fluid 800 does not contact the third segment 608. In other words, the first chamber 610 may not be completely filled with the heat-exchanging fluid 800 in a form of liquid.

The material of the heat-exchanging fluid 800 can include ammonia (in a form of liquid), acetone, methanol, ethanol, heptane, water, other suitable materials, or a combination thereof. Due to the fact that the heat-exchanging fluid 800 absorbs and releases heat during its phase change (will be discussed later), the material of the heat-exchanging fluid 800 can be selected based on the operating temperature of the circuit board to ensure the phase change of the heat-exchanging fluid 800 may happen in a range of the operating temperature of the circuit board. In some embodiments, the operating temperature of the circuit board is between about −70° C. and about 200° C. Therefore, materials whose phase change may happen at −70° C. to about 200° C. can be used as the heat-exchanging fluid 800.

Figure 9:
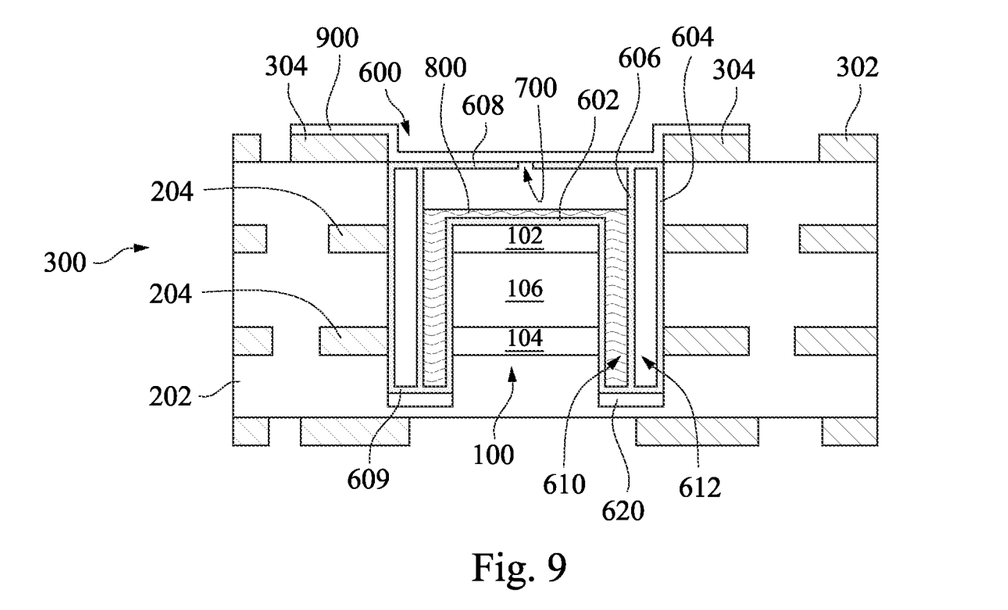

Referring to FIG. 9, FIG. 9 is a cross-sectional view of a circuit board at one of process stages according to some embodiments of the present application. FIG. 9 illustrates a process of disposing a heat-dissipating layer 900 on the insulation case 600. In some embodiments, the heat-dissipating layer 900 directly contacts the insulation case 600. The heat-dissipating layer 900 can cover the hole 700. After the hole 700 is covered with the heat-dissipating layer 900, the first chamber 610 may have the enclosed subspace. Therefore, the first chamber 610 can be sealed with the heat-dissipating layer 900. The heat-exchanging fluid 800 can be kept in the sealed first chamber 610 and surrounded by the first segment 602, the inner wall 606 and the third segment 608.

In addition, the heat-dissipating layer 900 can be further disposed on the heat-dissipating member 304 and directly contact the heat-dissipating member 304. In some embodiments, the heat-dissipating layer 900 continuously extends from the insulation case 600 to the heat-dissipating member 304. In some embodiments, the heat-dissipating layer 900 directly contacts the insulation case 600 and the heat-dissipating member 304.

The material of the heat-dissipating layer 900 can include epoxy, polyimide (PI), polyamide-imide (PAI), other suitable materials or a combination thereof.

Heat generated by electronic component 100 during operation can be rapidly transferred to the heat-exchanging fluid 800 in a form of liquid through the insulation case 600. The heat-exchanging fluid 800 in a form of liquid may absorb heat and become a form of gas. The heat-exchanging fluid 800 in a form of gas may then move in a direction toward the heat-dissipating layer 900.

The heat-exchanging fluid 800 in a form of gas can condense into the heat-exchanging fluid 800 in a form of liquid, as the heat-exchanging fluid 800 in a form of gas arrives the third segment 608 of the insulation case 600. In the process of the phase change of the heat-exchanging fluid 800, heat originally stored in the heat-exchanging fluid 800 can be released and transferred to the heat-dissipating layer 900 through the insulation case 600. Then, the heat-dissipating layer 900 can transfer heat to the external environment so heat can be dissipated away from the electronic component 100 and the third circuit substrate 300. In some embodiments, the heat-dissipating layer 900 may also transfer heat to the heat-dissipating member 304 in addition to the external environment, and then heat can be transferred to the external environment by the heat-dissipating member 304. Therefore, the efficiency of heat dissipation can be enhanced, thereby preventing heat accumulation in the electronic component 100 and the third circuit substrate 300.

After the heat-exchanging fluid 800 in a form of gas becomes the heat-exchanging fluid 800 in a form of liquid, the heat-exchanging fluid 800 in a form of liquid can flow in a direct toward the first segment 602 of the insulation case 600 (i.e., a proximity to the electronic component 100). As a result, the heat-exchanging fluid 800 can cycle in the insulation case 600 and meanwhile heat generated by the electronic component 100 can be continuously transferred to and dissipated by the heat-dissipating layer 900 and the heat-dissipating member 304 by the aforementioned approach.

The first chamber 610 near the electronic component 100, the heat-exchanging fluid 800 in the first chamber 610, the heat-dissipating layer 900 and the heat-dissipating member 304 can increase heat-dissipation efficiency, thereby boosting the performance of the electronic component 100.

On the other hand, a gas (e.g., air) is present in the second chamber 612 near the third circuit substrate 300. Due to air having a dielectric constant of approximate 1, the second chamber 612 can serve as an air gap to reduce the parasitic capacitance between the electronic component 100 and the circuit layer 204 of the third circuit substrate 300, helping the performance of the electronic component 100. In some embodiments, the second chamber 612 can be a vacuum chamber to serve as a spacer having even lower dielectric constant.

The present application discloses various embodiments to provide a circuit board and a method for manufacturing thereof. An electronic component and an insulation case are embedded in a circuit board. The electronic component is surrounded by the insulation case which has several chambers to provide various functions. The insulation case provide in the present application can increase the heat dissipation efficiency and decrease the parasitic capacitance. Therefore, the performance of the electronic component and the circuit board can be enhanced. In addition, in some embodiments where the electronic component is a capacitor (e.g., parallel-plate capacitor), the capacitor can be trimmed during process so the consistency among each capacitor can be increased, thereby increasing the reliability of the capacitor and the circuit board.

It will be apparent to those skilled in the art that various modifications and variations can be made to the structure of the present application without departing from the scope or spirit of the disclosure. In view of the foregoing, it is intended that the present application cover modifications and variations of this disclosure provided they fall within the scope of the following claims.

What is claimed is:

1. A method for manufacturing a circuit board, comprising:
   forming a recess in a first circuit substrate;
   disposing an electronic component in the recess;
   bonding a second circuit substrate to the first circuit substrate such that the second circuit substrate and the first circuit substrate collectively form a third circuit substrate, wherein the electronic component is embedded in the third circuit substrate;
   forming an opening in the third circuit substrate to expose the electronic component and an inner surface of the third circuit substrate in the opening;
   disposing an insulation case in the opening, wherein the insulation case comprises:
   a first segment surrounding and directly contacting the electronic component;
   a second segment positioned by the first segment and facing the inner surface;
   an inner wall between the first segment and second segment;
   a first chamber surrounded by the first segment and the inner wall; and
   a second chamber surrounded by the second segment and the inner wall; and
   adding a heat-exchanging fluid into the first chamber.

2. The method for manufacturing the circuit board of claim 1, wherein forming the opening in the third circuit substrate comprises making the opening extend from a top surface of the third circuit substrate to an inside of the third circuit substrate, and making a bottom of the opening is below a bottom of the electronic component.

3. The method for manufacturing the circuit board of claim 2, wherein a distance between the bottom of the opening and the bottom of the electronic component is larger than 10 μm.

4. The method for manufacturing the circuit board of claim 1, wherein
   forming the opening in the third circuit substrate comprises exposing a top surface and a side surface of the electronic component in the opening; and
   disposing the insulation case in the opening comprises making the first segment directly contact the top surface and the side surface of the electronic component.

5. The method for manufacturing the circuit board of claim 1, wherein disposing the insulation case in the opening comprises making the second segment directly contact the inner surface of the third circuit substrate.

6. The method for manufacturing the circuit board of claim 1, wherein disposing the insulation case in the opening comprises disposing an adhesive material between the insulation case and the third circuit substrate, and bonding the insulation case and the third circuit substrate with the adhesive material.

7. The method for manufacturing the circuit board of claim 1, further comprising:
   disposing a heat-dissipating layer on the insulation case, wherein the heat-dissipating layer directly contacts the insulation case.

8. The method for manufacturing the circuit board of claim 7, further comprising:
   forming a hole in the insulation case before adding the heat-exchanging fluid into the first chamber, wherein the heat-exchanging fluid is added into the first chamber through the hole.

9. The method for manufacturing the circuit board of claim 8, wherein disposing the heat-dissipating layer on the insulation case comprises covering the hole with the heat-dissipating layer to seal the first chamber and keep heat-exchanging fluid in the first chamber.

10. The method for manufacturing the circuit board of claim 1, wherein forming the opening in the third circuit substrate comprises removing a portion of the electronic component, such that a side surface of the electronic component is vertical.

11. The method for manufacturing the circuit board of claim 1, further comprising:
   disposing a heat-dissipating member on the third circuit substrate; and
   disposing a heat-dissipating layer on the insulation case and the heat-dissipating member, wherein the heat-dissipating layer directly contacts the insulation case and the heat-dissipating member.

12. A circuit board, comprising:
   a circuit substrate;
   an electronic component, embedded in the circuit substrate;
   an insulation case, embedded in the circuit substrate and between the circuit substrate and the electronic component, wherein the insulation case comprises:
   a first segment surrounding and directly contacting the electronic component;
   a second segment positioned by the first segment and facing an inner surface of the circuit substrate;
   an inner wall between the first segment and second segment;
   a first chamber surrounded by the first segment and the inner wall; and a second chamber surrounded by the second segment and the inner wall; and a heat-exchanging fluid, distributed in the first chamber.

13. The circuit board of claim 12, wherein a cross-sectional profile of the insulation case is an inverted-U shape.

14. The circuit board of claim 12, wherein the heat-exchanging fluid comprises a liquid and a gas.

15. The circuit board of claim 13, wherein a liquid level of the heat-exchanging fluid is identical to or higher than a top surface of the electronic component.

16. The circuit board of claim 12, wherein air is present in the second chamber.

17. The circuit board of claim 12, further comprising:

a heat-dissipating layer, disposed on and directly contacting the insulation case.

18. The circuit board of claim 17, further comprising:

a heat-dissipating member, disposed on the circuit substrate, wherein a projection of the heat-dissipating member on the circuit substrate is spaced away from a projection of the electronic component on the circuit substrate, and wherein the heat-dissipating layer is disposed on and directly contacts the heat-dissipating member.

19. The circuit board of claim 12, wherein the electronic component is a capacitor and comprises:

a first electrode;

a second electrode, disposed below the first electrode; and a dielectric layer, disposed between the first electrode and the second electrode, wherein a side surface of the first electrode, a side surface of the second electrode and a side surface of the dielectric layer are coplanar to each other.

20. The circuit board of claim 19, wherein the side surface of the first electrode, the side surface of the second electrode and the side surface of the dielectric layer directly contact the first segment;

a top surface of the first electrode directly contacts the first segment; and a bottom surface of the second electrode directly contacts the circuit substrate.

\* \* \* \* \*